(12) United States Patent
Manning

(10) Patent No.: US 6,611,059 B1
(45) Date of Patent: Aug. 26, 2003

(54) INTEGRATED CIRCUITRY CONDUCTIVE LINES

(75) Inventor: Monte Manning, Kuna, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 09/526,797

(22) Filed: Apr. 22, 1997

Related U.S. Application Data

(63) Continuation of application No. 08/597,196, filed on Feb. 6, 1996, now abandoned.

(51) Int. Cl.⁷ .................. H01L 23/54; H01L 27/108
(52) U.S. Cl. ............ 257/734; 257/638; 257/754; 257/758; 257/756; 257/316; 257/505; 257/506; 257/508; 257/510; 257/520; 257/208; 257/211
(58) Field of Search .................. 257/734, 754, 257/756, 758, 759, 765, 771, 774, 638, 644, 659, 208, 211, 316–319, 343, 354, 443, 446, 505–508, 510, 520

(56) References Cited

U.S. PATENT DOCUMENTS

| | | | | |
|---|---|---|---|---|
| 4,418,239 A | | 11/1983 | Larson et al. .................. 174/34 |
| 4,686,759 A | * | 8/1987 | Pals et al. .................... 257/734 |
| 4,693,530 A | | 9/1987 | Stillie et al. .................. 439/67 |
| 4,780,394 A | * | 10/1988 | Blanchard et al. ............ 257/754 |
| 4,781,620 A | | 11/1988 | Tengler et al. ................ 439/497 |
| 4,922,323 A | * | 5/1990 | Potter ........................ 257/758 |
| 4,933,743 A | | 6/1990 | Thomas et al. .............. 357/71 |
| 5,000,818 A | | 3/1991 | Thomas et al. .............. 156/643 |
| 5,028,981 A | * | 7/1991 | Eguchi ........................ 257/734 |
| 5,117,276 A | | 5/1992 | Thomas et al. .............. 357/71 |
| 5,123,325 A | | 6/1992 | Turner ........................ 84/731 |
| 5,176,538 A | | 1/1993 | Hansell, III et al. ......... 439/607 |
| 5,323,048 A | * | 6/1994 | Onuma ........................ 257/754 |
| 5,329,155 A | | 7/1994 | Lao et al. .................... 257/659 |
| 5,413,961 A | | 5/1995 | Kim ........................... 438/639 |
| 5,451,551 A | | 9/1995 | Krishnan et al. |
| 5,471,093 A | * | 11/1995 | Cheung ....................... 257/758 |
| 5,519,239 A | | 5/1996 | Chu ........................... 257/314 |
| 5,552,628 A | * | 9/1996 | Watanabe et al. ............ 257/758 |
| 5,583,357 A | * | 12/1996 | Choe .......................... 257/758 |
| 5,585,664 A | * | 12/1996 | Ito ............................. 257/758 |
| 5,654,917 A | | 8/1997 | Ogura et al. ............. 365/185.19 |
| 5,656,543 A | | 8/1997 | Chung ........................ 438/625 |
| 5,956,615 A | | 9/1999 | Nguyen et al. |

FOREIGN PATENT DOCUMENTS

| | | | | |
|---|---|---|---|---|
| JP | 0054925 | * | 2/1990 | ............ 257/734 |
| JP | 054925 | | 2/1990 | ............ 257/734 |
| JP | 0097300 | * | 4/1994 | ............ 257/758 |

OTHER PUBLICATIONS

Thomas, Michael E. et al., "VLSI Multilevel Micro–Coaxial Interconnects For High Speed Devices", 1990 IEEE, pp. 55–58.

* cited by examiner

Primary Examiner—Alexander O. Williams
(74) Attorney, Agent, or Firm—Wells St. John P.S.

(57) ABSTRACT

Integrated circuitry includes a semiconductive substrate, an insulative material over the semiconductive substrate, and a series of alternating first and second conductive lines, the first and second lines being spaced and positioned laterally adjacent one another over the insulating layer. At least some of the laterally adjacent conductive lines may have different cross-sectional shapes in a direction perpendicular to the respective line. Alternatively, or in addition, individual second series conductive lines may be spaced from adjacent first series conductive lines a distance that is less than a minimum width of the first series lines.

24 Claims, 4 Drawing Sheets

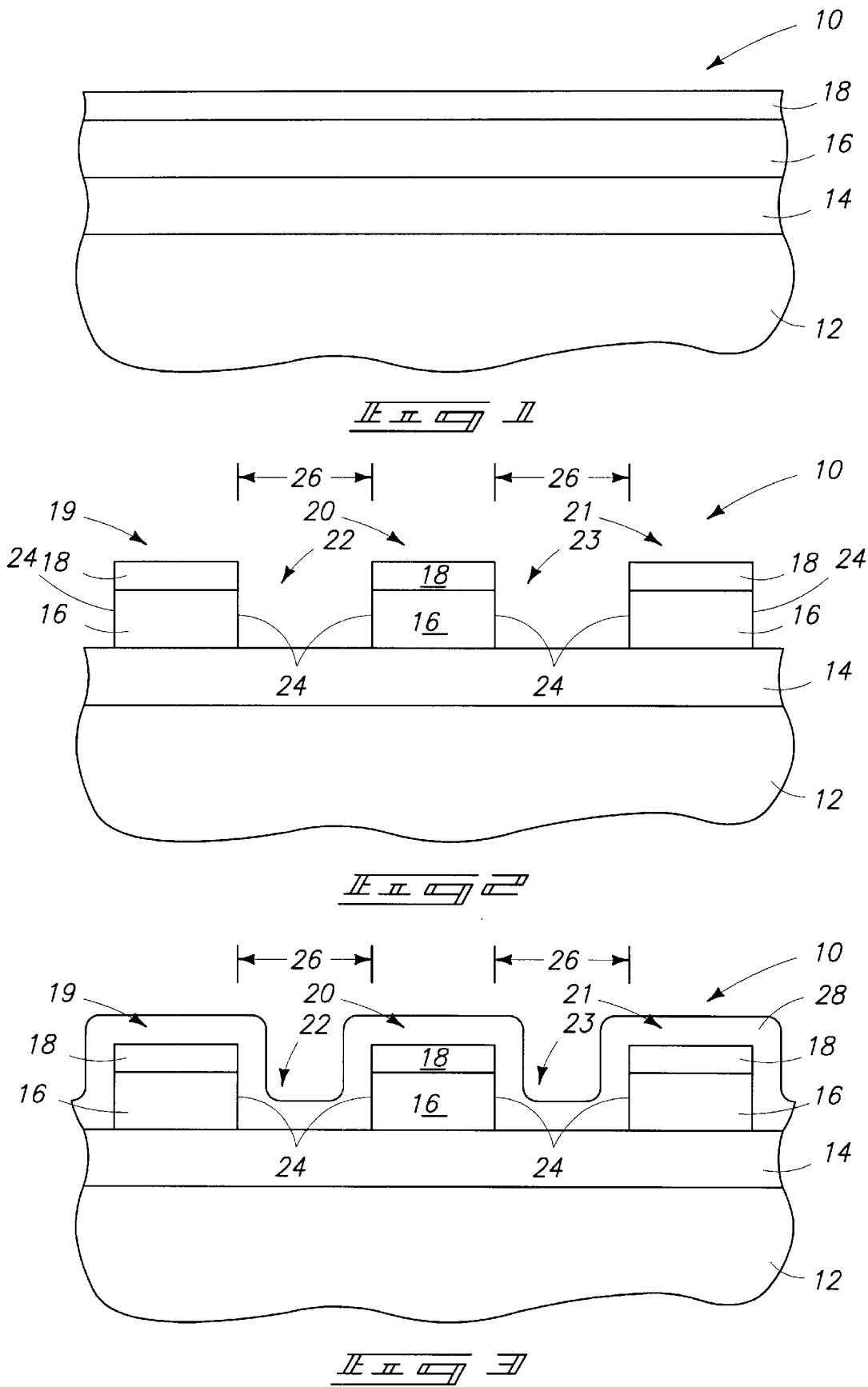

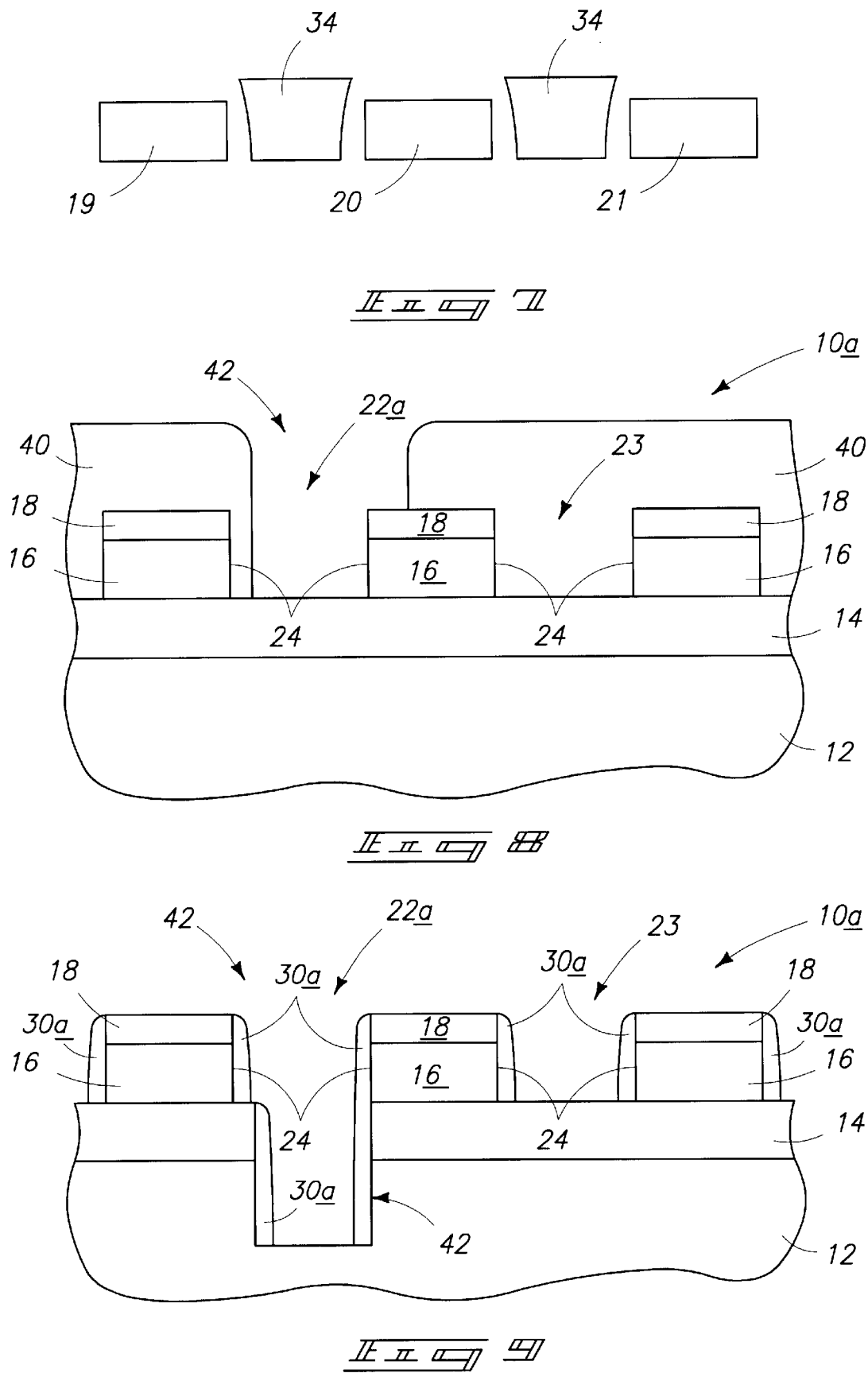

INTEGRATED CIRCUITRY CONDUCTIVE LINES

RELATED PATENT DATA

This patent resulted from a file wrapper continuation application of application Ser. No. 08/597,196, filed Feb. 6, 1996, now abandoned and entitled "Integrated Circuitry and a Semiconductor Processing Method of Forming a Series of Conductive Lines," naming Monte Manning as the inventor. This patent is also related to application Ser. No. 08/742, 782, now U.S. Pat. No. 6,096,636, which is a divisional application of application Ser. No. 08/597,196, now abandoned.

This invention was made with Government support under Contract No. MDA972-92-C-0054 awarded by Advanced Research Projects Agency (ARPA). The Government has certain rights in this invention.

TECHNICAL FIELD

This invention relates to semiconductor processing methods of forming a series of conductive lines and to integrated circuitry having lo a series of conductive lines.

BACKGROUND OF THE INVENTION

The high speed operation of future higher density integrated circuits will be dictated by interconnect response. Realization of such high speed circuitry is impacted by cross-talk between different adjacent interconnect lines. Cross-talk imposes the biggest constraint on high speed operation when frequencies exceed 500 MHz. Lowering the conductive line resistivity or the dielectric constant of insulators interposed between conductive metal lines is not expected to inherently solve the cross-talk problem. In addition, the gain in system response is only enhanced by a factor of 3, at best, when these changes are ideally integrated into manufacturing processes.

Future circuits will also incorporate higher drive devices. In such situations, as the circuits change state (e.g., from high voltage to low voltage in a CMOS circuit), the interconnect line that carries the signal to the next active device will often be closely spaced to another interconnect line whose driver is not changing state. However given the speed of the voltage change on the first line and the spacing from the second, capacitive coupling will undesirably cause the second line to follow the first momentarily. This situation is made worse when the device driving the second line is small compared to the driver switching the first line. Here, the driver driving the second line does not have enough drive to maintain the output line's desired voltage during the first line's transition from high voltage to low voltage. Therefore, the second line follows the first. This can cause upset in circuits tied to the second line and cause the chip to fail or temporarily operate incorrectly.

One prior art technique to decouple adjacent interconnect lines is to fully enclose lines in a conductive shield, such as a coaxial sheath around a central core interconnect line. Such processing to produce such construction is however complex, and alternate methods and resultant circuitry constructions are desired.

BRIEF DESCRIPTION OF THE DRAWINGS

Preferred embodiments of the invention are described below with reference to the following accompanying drawings.

FIG. 1 is a diagrammatic sectional view of a semiconductor wafer fragment at one processing step in accordance with the invention.

FIG. 2 is a view of the FIG. 1 wafer fragment at a processing step subsequent to that shown by FIG. 1.

FIG. 3 is a view of the FIG. 1 wafer fragment at a processing step subsequent to that shown by FIG. 2.

FIG. 7 is a diagrammatic representation intended to emphasize conductive line cross-sectional shapes.

FIG. 8 is a view of the FIG. 1 wafer fragment at an alternate processing step subsequent to that shown by FIG. 2.

FIG. 9 is a view of the FIG. 8 wafer fragment at a processing step subsequent to that shown by FIG. 8.

DETAILED DESCRIPTION OF THE PREFERRED EMBODIMENTS

Figure 4:
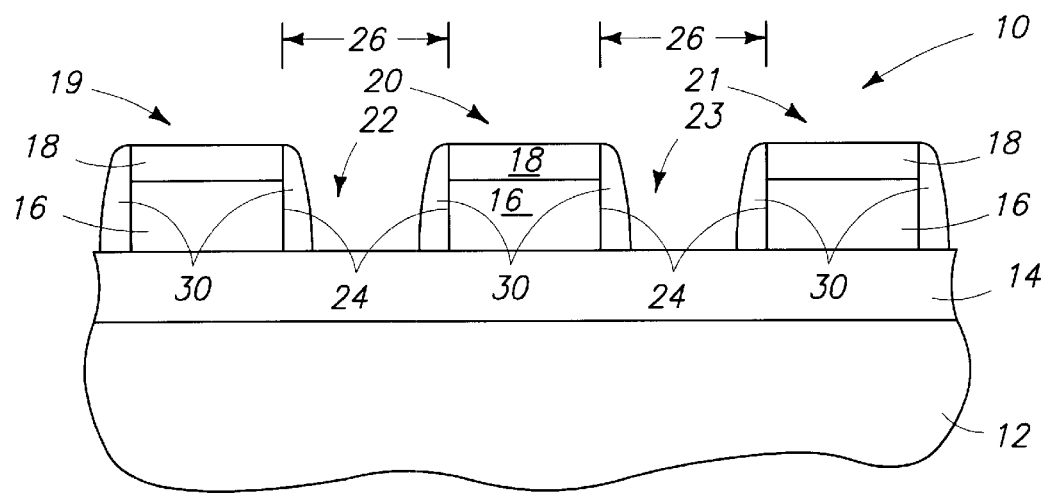
FIG. 4 is a view of the FIG. 1 wafer fragment at a processing step subsequent to that shown by FIG. 3.

This disclosure of the invention is submitted in furtherance of the constitutional purposes of the U.S. Patent Laws "to promote the progress of science and useful arts" (Article 1, Section 8).

In accordance with one aspect of the invention, a semiconductor processing method of forming a plurality of conductive lines comprises the following steps:

providing a substrate;

providing a first conductive material layer over the substrate;

etching through the first conductive layer to the substrate to both form a plurality of first conductive lines from the first conductive layer and provide a plurality of grooves between the first lines, the first lines having respective sidewalls;

electrically insulating the first line sidewalls; and after insulating the sidewalls, providing the grooves with a second conductive material to form a plurality of second lines within the grooves which alternate with the first lines.

In accordance with another aspect of the invention, integrated circuitry comprises:

a substrate; and a series of alternating first and second conductive lines provided relative to the substrate, the first and second lines being spaced and positioned laterally adjacent one another relative to the substrate, the first lines and the second lines being electrically isolated from one another laterally by intervening anisotropically etched insulating spacers formed laterally about only one of the first or second series of lines.

In accordance with still a further aspect of the invention, integrated circuitry comprises:

a substrate; and a series of alternating first and second conductive lines provided relative to the substrate, the first and second lines being spaced and positioned laterally adjacent one another relative to the substrate, the first lines and the second lines being electrically isolated from one another laterally by intervening strips of insulating material, the first lines having a substantially common lateral cross sectional shape and the second lines having a substantially common lateral cross sectional shape, the first lines' lateral cross sectional shape being different from the second lines' lateral cross sectional shape.

Referring first to FIG. 1, a semiconductor wafer fragment in process is indicated generally with reference numeral 10. Such comprises a bulk monocrystalline silicon wafer 12 and an overlying electrical insulating layer 14. An example material for layer 14 is borophosphosilicate glass (BPSG). A first electrically conductive material layer 16 is provided over substrate 14. An example material for layer 16 is doped or undoped polysilicon deposited to an example thickness range of from 2000 Angstroms to 10,000 Angstroms. Other conductive materials, such as metal, might also be provided although polysilicon is preferred due to its resistance to subsequent high temperature processing.

In accordance with the preferred embodiment, layer 16 will ultimately be utilized as a cross-talk shield between otherwise adjacent conductive lines. Accordingly, its degree of conductivity should be effective to function in this regard. It can in essence be a semiconductive material, such as undoped polysilicon which will have effective conductivity to function as a cross-talk shield.

A first insulating layer 18 is provided over first conductive layer 16. An example and preferred material for layer 18 is $SiO_2$ deposited by decomposition of tetraethylorthosilicate (TEOS).

Referring to FIG. 2, first insulating layer 18 and first conductive layer 16 is photopatterned and etched through to substrate 14 to form a plurality of first conductive lines 19, 20 and 21 from first conductive layer 16 and provide a plurality of grooves 22 and 23 between first lines 19, 20 and 21. Accordingly in the preferred embodiment, first lines 19, 20 and 21 are capped by first insulating layer material 18. For purposes of the continuing discussion, first lines 19, 20 and 21 have respective sidewalls 24. Also, grooves 22 and 23 have respective open widths 26, with 5000 Angstroms being an example.

Referring to FIG. 3, a second insulating material layer 28 is deposited over etched first insulating layer 18 and first conductive layer 16, and over first line sidewalls 24, to a thickness which is less than one-half the respective groove open widths 26 to less than completely fill grooves 22 and 23. An example and preferred material for layer 28 is $SiO_2$ deposited by decomposition of TEOS, to an example thickness of 1000 Angstroms.

Figure 5:
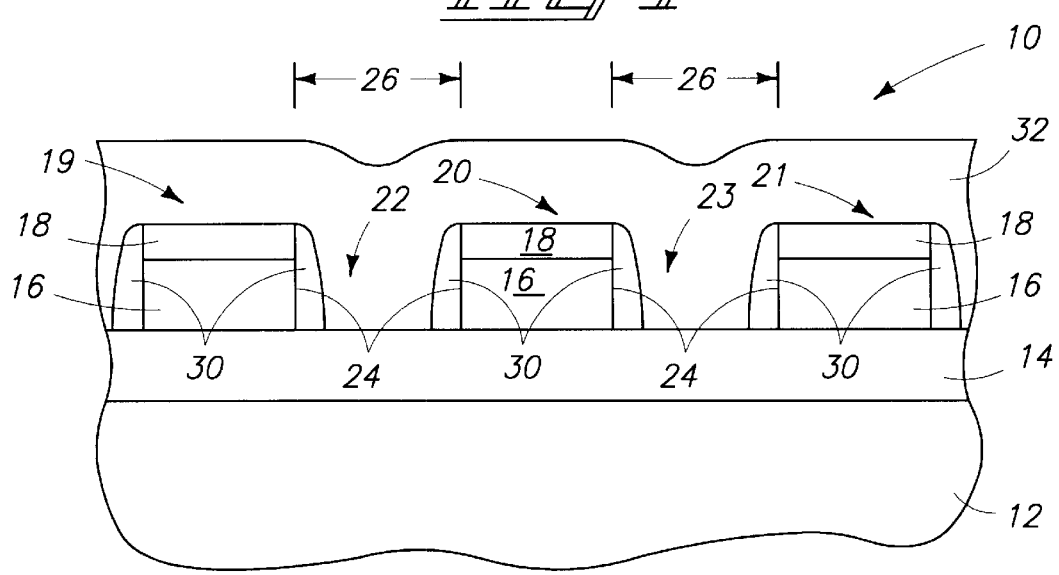
FIG. 5 is a view of the FIG. 1 wafer fragment at a processing step subsequent to that shown by FIG. 4.

Referring to FIG. 4, second insulating material layer 28 is anisotropically etched to define insulating sidewall spacers 30 over first line sidewalls 24. Such provides but one example of electrically insulating first line sidewalls 24. Sidewall oxidation or other techniques could be utilized. First insulating material 18 and second insulating material 28 can constitute the same or different materials. In the described and preferred embodiment, each predominantly comprises $SiO_2$ which is substantially undoped. Alternately, one or both could be doped with phosphorus, boron or some other suitable dopant. Referring to FIG. 5, a second conductive material layer 32 is deposited to a thickness effective to fill remaining portions of grooves 22 and 23.

Figure 6:
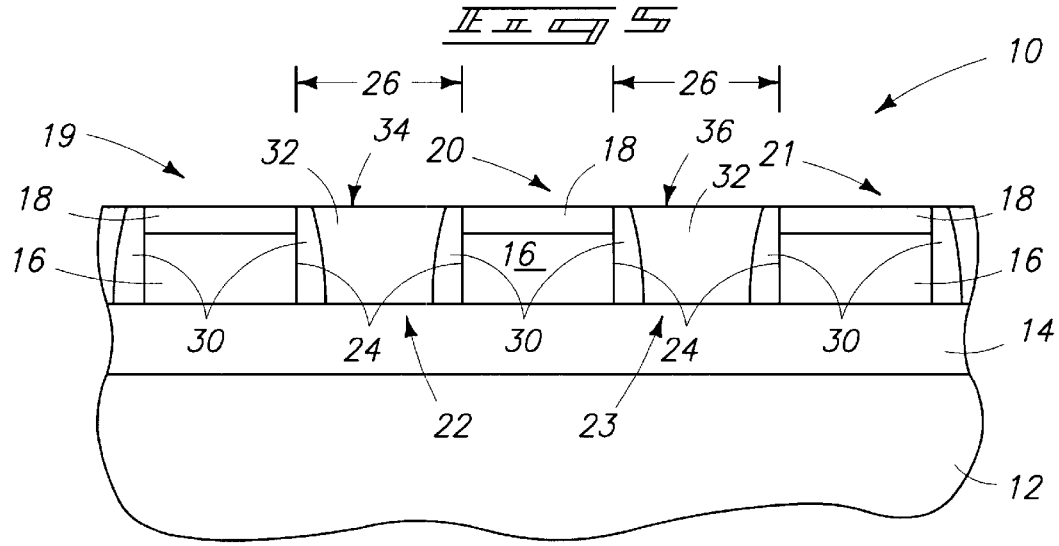
FIG. 6 is a view of the FIG. 1 wafer fragment at a processing step subsequent to that shown by FIG. 5.

Referring to FIG. 6, second conductive material layer 32 is planarize etched to form a plurality of second lines 34, 36 within grooves 22 and 23 which alternate with first lines 19, 20 and 21. Such provides but one example of a preferred method of providing grooves 22 and 23 with effectively conductive interconnect lines therein. Second conductive material 32 can be the same as or different from first conductive material 16. An example and preferred material for layer 32, and accordingly resultant lines 34 and 36 is metal, such as aluminum or an aluminum alloy. In such a preferred embodiment, interconnect lines 34 and 36 constitute desired resultant conductive lines, with the series of first lines 19, 20 and 21 providing effective shielding therebetween. Again, the shielding lines only need be effectively electrically conductive to shield one interconnect line from the adjacent interconnect line. Such shielded lines may be biased to some suitable voltage, or left unbiased. Alternately in, accordance with an aspect of the invention, the functions and compositions of the first and second sets of conductive lines can be reversed, whereby lines 34, 36 function as effective shielding between conductive lines 19, 20 and 21.

Accordingly, a method and construction are described whereby a series of conductive lines 19, 20 and 21 are positioned laterally adjacent another set of conductive lines 34, 36. Such are isolated from one another laterally by intervening strips of insulating material, which in the preferred embodiment constitute intervening anisotropically etched insulating spacers formed laterally about only first series of lines 19, 20 and 21. Further in accordance with an aspect of the invention, first lines 19, 20 and 21 have a substantially common lateral cross-sectional shape, and second lines 34 and 36 also have a substantially common lateral cross-sectional shape. Yet, the first lines' 19, 20 and 21 lateral cross-sectional shape is different from that of the second lines' lateral cross-sectional shape. This is most readily apparent from FIG. 7, wherein other layers have been deleted to emphasize the respective shapes of the first and second lines.

An alternate described embodiment whereby contact openings are provided is described with reference to FIGS. 8 and 9. Like numerals from the first described embodiment are utilized where appropriate with differences being indicated by the suffix "a" or with different numerals. FIG. 8 illustrates a semiconductor wafer fragment 10a at a processing step immediately subsequent to that depicted by FIG. 2. Here, a photoresist masking layer 40 has been deposited and patterned as shown for formation of a desired contact opening 42. FIG. 9 illustrates such contact opening 42 having been formed, followed by subsequent deposition and anisotropic etching to produce the illustrated spacers 30a. Subsequent deposition of a second conductive layer and planarized etching thereof, again preferably without photomasking, would subsequently occur.

Figure 10:
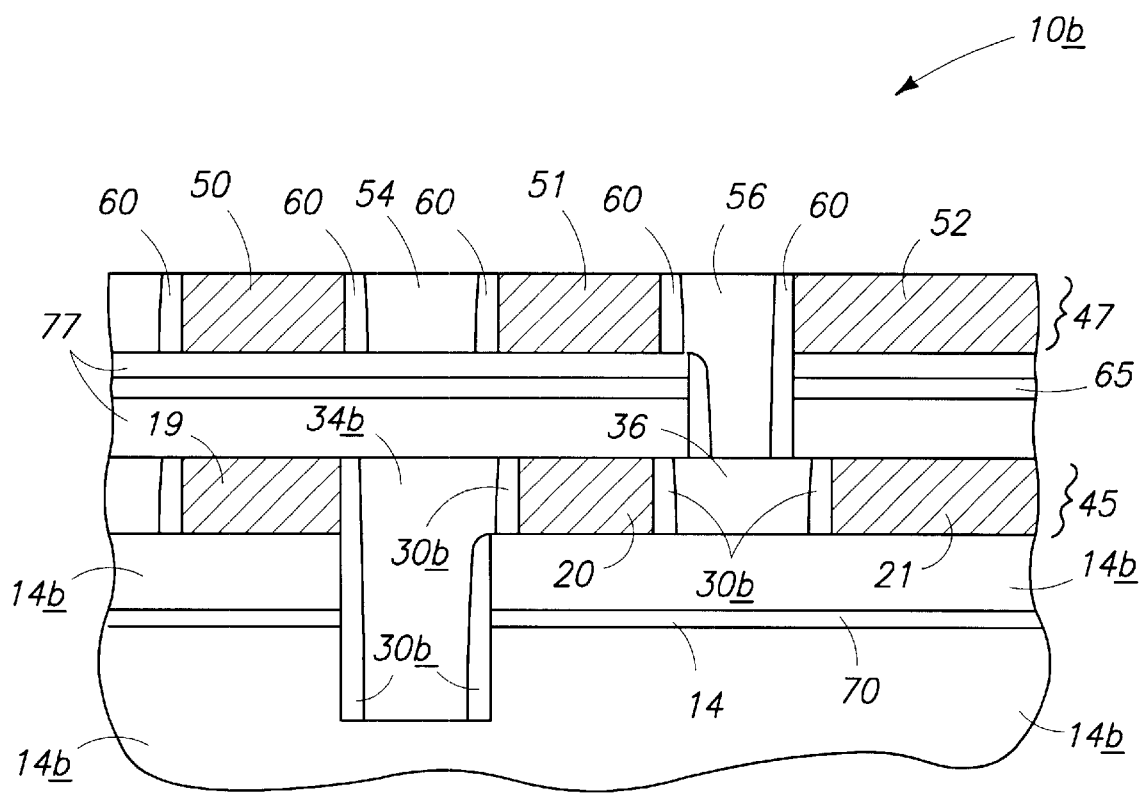
FIG. 10 is a view of an alternate embodiment semiconductor wafer fragment in accordance with the invention.

FIG. 10 illustrates yet another alternate embodiment wafer fragment 10b. Like numerals from the first described embodiment are utilized where appropriate, with differences being indicated by the suffix "b" or with different numerals. FIG. 10 illustrates an alternate conception whereby a plurality of series of the first and second conductive lines are formed at multiple elevations relative to substrate 14b. A region 45 illustrates one elevation relative to substrate 14b where first series of first lines 19, 20 and 21 and second lines 34b and 36 are formed. A region of elevation 47 shows an additional level where a second series of first lines 50, 51 and 52, and second lines 54 and 56 are provided, utilizing intervening anisotropically etched insulating spacers 60.

An interlevel dielectric layer construction 77 is provided between the two line sets. Additional separate horizontal intervening shielding layers 65 and 70 can and are provided relative to the interlevel dielectric layers 77 and 14b, respectively, to afford desired cross-talk shielding between the different levels of first and second conductive lines. Further in the depicted embodiment, line 34b is shown to extend downwardly for electrical contact with a different level. Likewise, line 56 from elevation 47 effectively extends downwardly to make electrical contact with line 36. If desired, all such shields in either embodiment may be interconnected and connected to a suitable potential.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

What is claimed is:

1. Integrated circuitry comprising:
   a semiconductive substrate;
   an electrically insulating layer disposed elevationally over the semiconductive substrate; and
   a series of alternating first and second conductive lines, the first a and second lines being spaced and positioned laterally adjacent one another over the insulating layer, at least some individual laterally adjacent first and second series lines being disposed directly on the electrically insulating layer, the first lines and the second lines having respective line tops, and being electrically isolated from one another laterally by intervening insulating spacers having respective spacer tops which are substantially coplanar with at least some of the first and second line tops, at least some laterally adjacent conductive lines having different cross sectional shapes in a direction perpendicular to the respective line.

2. The integrated circuitry of claim 1 wherein the first lines have a substantially common lateral cross sectional shape and the second lines have a substantially common lateral cross sectional shape, the first lines' lateral cross sectional shape being different from the second lines' lateral cross sectional shape.

3. The integrated circuitry of claim 1 wherein the first and second conductive lines constitute the same materials.

4. The integrated circuitry of claim 1 wherein the first and second conductive lines constitute different materials.

5. The integrated circuitry of claim 1 wherein the first conductive lines predominately comprise undoped polysilicon and the second conductive lines predominately comprise metal.

6. The integrated circuitry of claim 1 wherein the first conductive lines predominately comprise doped polysilicon and the second conductive lines predominately comprise metal.

7. The integrated circuitry of claim 1 comprising a plurality of the series of the first and second conductive lines at multiple elevations relative to the substrate.

8. Integrated circuitry comprising:
   a semiconductive substrate;
   a layer of electrically insulating material atop the semiconductive substrate; and
   a series of alternating first and second conductive lines provided relative to the substrate, each of the lines being disposed on the layer of insulating material, the first and second lines having respective lateral widths and being spaced and positioned laterally adjacent one another relative to the substrate, the first lines and the second lines being electrically isolated and separated from one another laterally by intervening strips of insulating material having respective individual insulating material lateral widths which are substantially less than the lateral widths of any of the first and second conductive lines, the first lines having a substantially common lateral cross sectional shape and the second lines having a substantially common lateral cross sectional shape, the first lines' lateral cross sectional shape being different from the second lines' lateral cross sectional shape, none of the lines overlapping any immediately laterally adjacent lines.

9. The integrated circuitry of claim 8 wherein the first and second conductive lines constitute the same materials.

10. The integrated circuitry of claim 8 wherein the first and second conductive lines constitute different materials.

11. The integrated circuitry of claim 8 wherein the first conductive lines predominately comprise undoped polysilicon and the second conductive lines predominately comprise metal.

12. The integrated circuitry of claim 8 wherein the first conductive lines predominately comprise doped polysilicon and the second conductive lines predominately comprise metal.

13. The integrated circuitry of claim 8 comprising a plurality of the series of the first and second conductive lines at multiple elevations relative to the substrate.

14. Integrated circuitry comprising:
   a semiconductive substrate;
   an electrically insulative borophosphosilicate glass (BPSG) layer disposed atop the semiconductive substrate;
   a series of first conductive polysilicon lines, individual first series lines being disposed atop the BPSG layer and having respective elevational thicknesses in a range from 2000 Angstroms to 10,000 Angstroms and individual respective sidewalls which define substantially common lateral cross sectional shapes;
   electrically insulative oxide material disposed over respective first series conductive lines, the oxide material over at least some of the lines defining a first plane;
   a plurality of grooves, individual grooves being disposed between laterally adjacent first series lines and having respective lateral open widths;
   a plurality of insulative oxide sidewall spacer pairs, individual of said pairs being disposed in different grooves atop the BPSG layer and immediately laterally adjacent and connected with respective sidewalls of an individual first series conductive line, respective sidewall spacers extending elevationally outward of the BPSG layer and being connected with the electrically insulating oxide material which is disposed over the individual first series conductive line with which the sidewall spacer is connected,
   individual sidewall spacers having respective lateral thicknesses which are less than the about half the lateral open width of the groove in which the spacer is disposed, individual sidewall spacer lateral thicknesses effectively leaving at least some of the groove in which the spacer is disposed unoccupied with any spacer material,
   individual first series conductive lines being effectively insulated by the BPSG layer, the individual respective sidewall spacers, and the individual respective insulating oxide material disposed over the line top; and
   a series of second conductive aluminum-containing lines having respective line tops at least some of which define a second plane which is coplanar with said first plane, said series of second conductive lines being disposed atop the BPSG layer, individual second series lines being disposed in individual respective grooves adjacent and connected with respective sidewall spacers which are disposed in the same groove, laterally adjacent conductive lines of the first and second series having different lateral cross sectional shapes.

15. Integrated circuitry comprising:

a semiconductive substrate;

an insulative layer of material disposed atop the semiconductive substrate;

a first series of conductive lines disposed atop the insulative layer, individual conductive lines having substantially common lateral cross sectional shapes;

shielding material disposed over and laterally adjacent the individual conductive lines and having a generally planar shielding material top, the shielding material being connected with the insulative layer to effectively electrically isolate the individual conductive lines; and a second series of conductive lines at least some of which being disposed atop the insulative layer and having respective line tops at least some of which being coplanar with the shielding material top, individual second series lines being disposed between individual pairs of first series lines and being electrically isolated therefrom by the shielding material, individual second series lines having lateral cross sectional shapes which are different from adjacent first series line lateral cross sectional shapes.

16. The integrated circuitry of claim 15, wherein individual second series lines have substantially a common lateral cross sectional shape.

17. The integrated circuitry of claim 15, wherein:

individual first series lines comprise respective laterally outward facing sidewalls; and the shielding material comprises a plurality of sidewall spacers individual spacers of which being disposed atop the insulative layer and joined with respective first series line sidewalls, at least some of the individual second series lines being joined with at least one sidewall spacer.

18. Integrated circuitry comprising:

a semiconductive substrate;

an insulative layer of material disposed atop the semiconductive substrate;

a first series of patterned conductive lines disposed atop the insulative layer and having generally coplanar first series lines tops;

shielding material disposed laterally adjacent individual first series patterned conductive lines, the shielding material being connected with the insulative layer to effectively electrically isolate the individual first series patterned conductive lines, the shielding material having a shielding material top which is coplanar with the first series line tops; and a second series of conductive lines at least some of which being disposed atop the insulative layer and having respective second series line tops which are generally coplanar with each other and with at least some of the first series line tops, individual second series conductive lines being disposed between individual pairs of first series patterned conductive lines and being electrically isolated therefrom by the shielding material, individual second series conductive lines being spaced from adjacent first series patterned conductive lines a distance which is less than a minimum photolithographic feature spacing which was utilized to form the first series patterned conductive lines.

19. The integrated circuitry of claim 18, wherein each of said individual second series conductive lines are disposed atop the insulative layer.

20. The integrated circuitry of claim 18, wherein none of said first series of patterned conductive lines overlaps with any immediately laterally adjacent second series conductive lines.

21. The integrated circuitry of claim 18, wherein each of said individual second series conductive lines is disposed atop the insulative layer and none of said first series of patterned conductive lines overlaps with any immediately laterally adjacent second series conductive lines.

22. Integrated circuitry comprising:

a semiconductive substrate;

an insulative layer of material disposed atop the semiconductive substrate;

a first series of patterned conductive lines disposed over the insulative layer, the first series lines having a minimum width;

shielding material disposed laterally adjacent individual first series patterned conductive lines, the shielding material being connected with the insulative layer to effectively electrically isolate the individual first series patterned conductive lines; and a second series of conductive lines disposed over the insulative layer, individual second series conductive lines being disposed between individual pairs of first series patterned conductive lines and being electrically isolated therefrom by the shielding material, at least some individual laterally adjacent first and second series lines being disposed directly on the insulative layer and having respective line tops which are substantially coplanar, individual second series conductive lines being spaced from adjacent first series patterned conductive lines a distance which is less than the minimum width of the first series lines.

23. The integrated circuitry of claim 22, wherein each of said individual second series conductive lines are disposed directly on the insulative layer.

24. The integrated circuitry of claim 22, wherein none of said first series of patterned conductive lines overlaps with any immediately laterally adjacent second series conductive lines.

* * * * *

UNITED STATES PATENT AND TRADEMARK OFFICE
CERTIFICATE OF CORRECTION

PATENT NO. : 6,611,059 B1
DATED : August 26, 2003
INVENTOR(S) : Monte Manning

It is certified that error appears in the above-identified patent and that said Letters Patent is hereby corrected as shown below:

Title page, Item [54] and Column 1, line 1,
Title, please insert -- WITH A SERIES OF -- after "CIRCUITRY".

Column 1,
Line 24, please delete "lo" after "having".

Column 4,
Line 11, please delete "," after "in".

Column 5,
Line 21, please delete "a" after "first".

Signed and Sealed this

Fourteenth Day of December, 2004

JON W. DUDAS
*Director of the United States Patent and Trademark Office*